United States Patent [19]
Dunlap et al.

[11] Patent Number: 5,917,352
[45] Date of Patent: Jun. 29, 1999

[54] THREE-STATE PHASE-DETECTOR/CHARGE PUMP WITH NO DEAD-BAND OFFERING TUNABLE PHASE IN PHASE-LOCKED LOOP CIRCUITS

[75] Inventors: Frank M. Dunlap, Palo Alto; Vincent S. Tso, Milpitas, both of Calif.

[73] Assignee: Sierra Semiconductor, San Jose, Calif.

[21] Appl. No.: 08/941,347

[22] Filed: Sep. 30, 1997

Related U.S. Application Data

[63] Continuation of application No. 08/253,779, Jun. 3, 1994, abandoned.

[51] Int. Cl.$^6$ .................................................. H03L 7/00
[52] U.S. Cl. ...................... 327/158; 327/156; 327/147; 327/149; 327/3; 327/12; 331/1 A; 331/11; 375/376
[58] Field of Search ............................ 331/DIG. 2, 11, 331/17, 1 A; 327/133, 5, 7, 147, 148, 149, 153, 156, 157, 158, 161, 236, 244, 3; 375/373, 374, 376

[56] References Cited

U.S. PATENT DOCUMENTS

| | | | |
|---|---|---|---|
| 4,322,643 | 3/1982 | Preslar | 327/5 |
| 4,380,083 | 4/1983 | Andersson et al. | 327/159 |
| 4,795,985 | 1/1989 | Gillingham et al. | 327/158 |
| 4,803,705 | 2/1989 | Gillingham et al. | 331/17 |
| 4,901,026 | 2/1990 | Phillips et al. | 331/25 |
| 4,970,469 | 11/1990 | Kasperkovitz | 329/325 |
| 5,036,216 | 7/1991 | Hohmann et al. | 331/1 R |
| 5,408,200 | 4/1995 | Buhler | 331/1 A |

*Primary Examiner*—Timothy P. Callahan
*Assistant Examiner*—Dinh Le
*Attorney, Agent, or Firm*—Burns, Doane, Swecker & Mathis, LLP

[57] ABSTRACT

The present invention is directed to providing a phase detector capable of establishing phase-locked-loop operation in a highly accurate and reliable manner. For example, exemplary embodiments detect a phase difference between at least two input signals to phase lock the input signals to one another. Exemplary embodiments include two phase detectors each of which receives the two input signals (e.g., three-state phase detectors), and each of which is forced to operate outside of its dead-band region by introducing predetermined phase delays for its inputs. Each of the two phase detectors detects a phase difference between its respective inputs. The two phase differences are then combined to produce a composite output signal formed as a net charge proportional to the net phase difference detected by the two phase detectors.

15 Claims, 2 Drawing Sheets

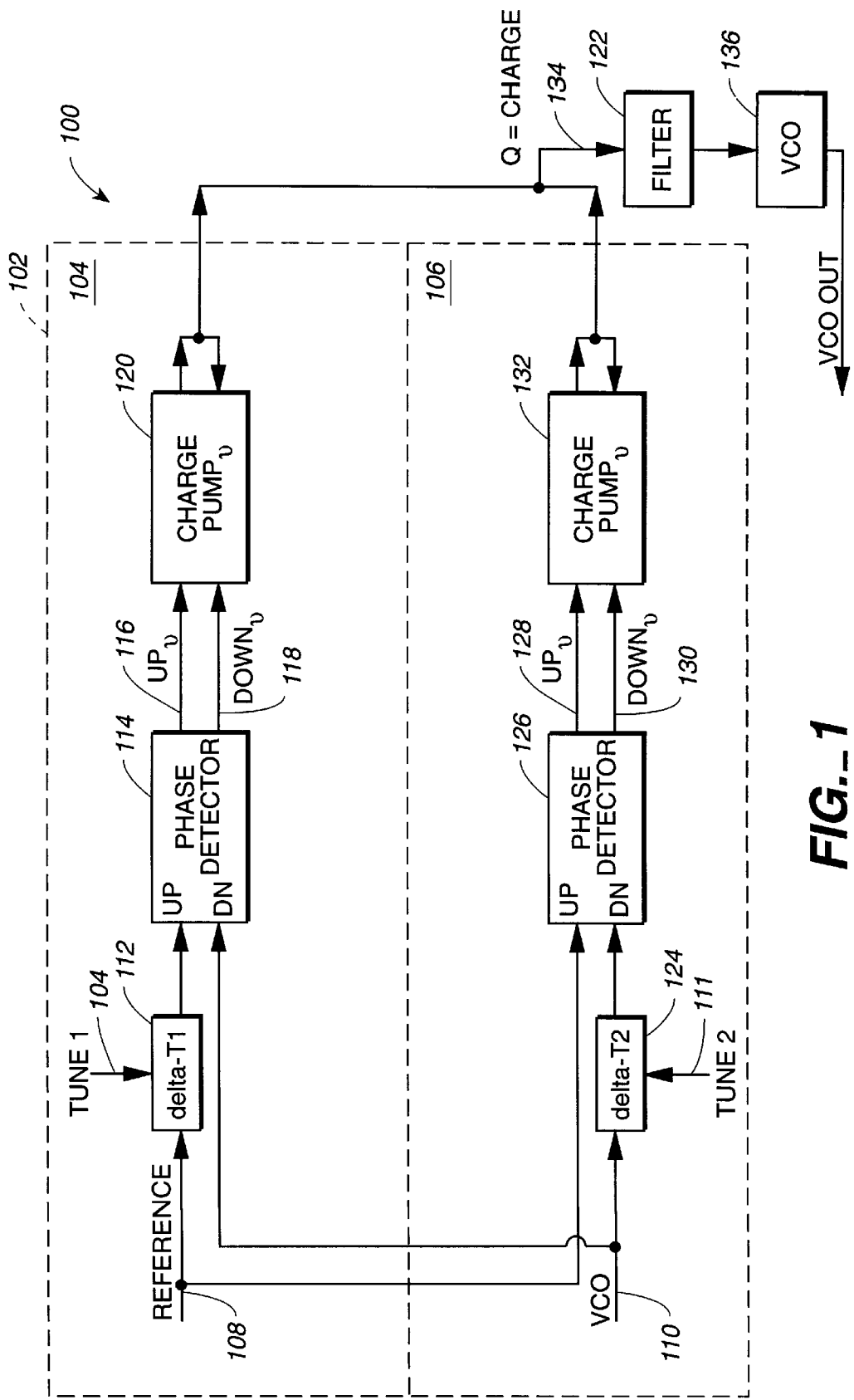
FIG._1

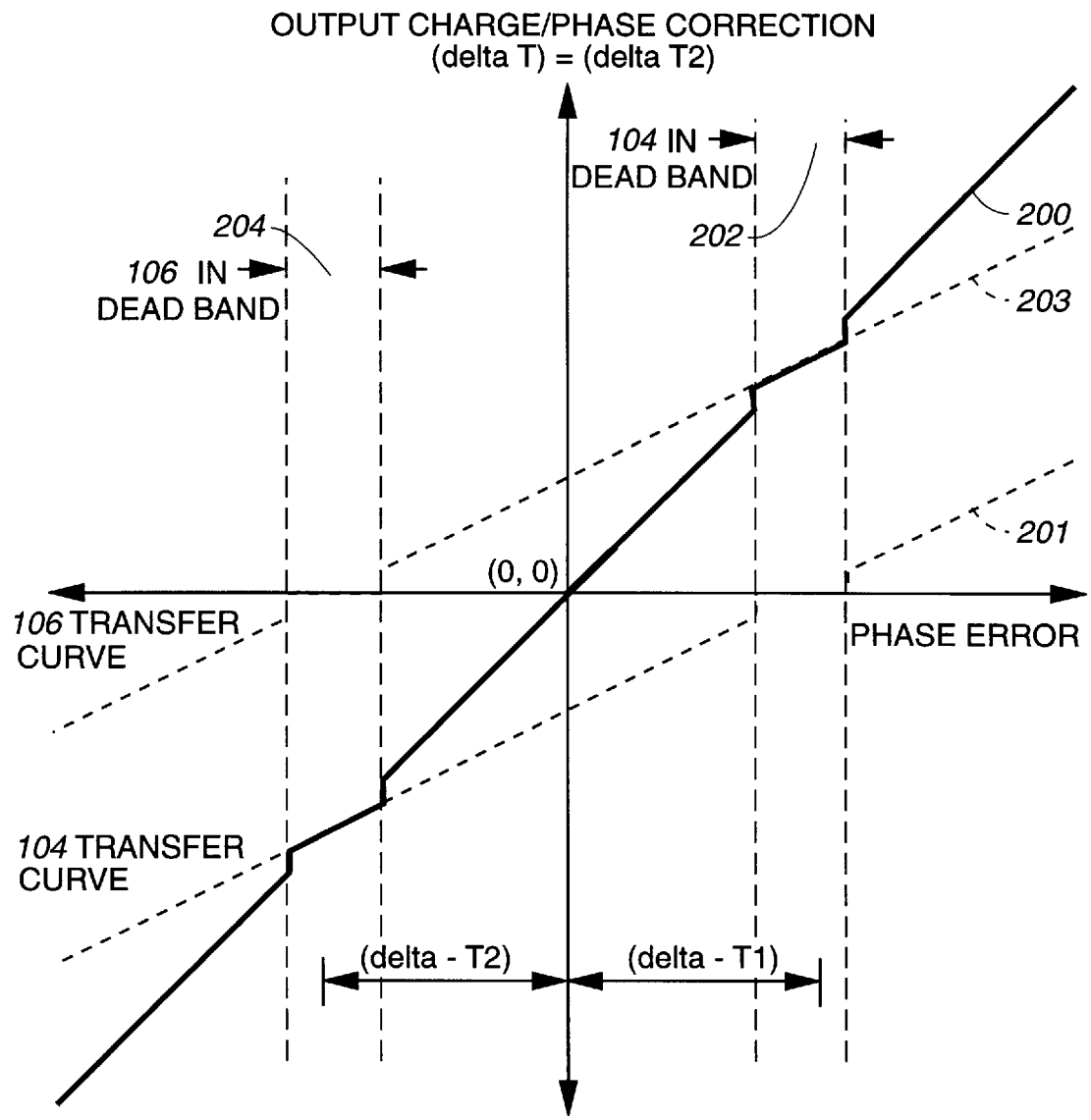
FIG._2

THREE-STATE PHASE-DETECTOR/CHARGE PUMP WITH NO DEAD-BAND OFFERING TUNABLE PHASE IN PHASE-LOCKED LOOP CIRCUITS

This application is a continuation of application Ser. No. 08/253,779, filed Jun. 3, 1994 now abandoned.

BACKGROUND OF THE INVENTION

1. Field of the Invention

The present invention relates generally to signal processing, and more particularly to accurate detection of phase differences between two signals.

2. State of the Art

Phase detector circuits are well known. For example, known circuits include combinations of phase detectors and charge pumps for detecting a phase difference between two clock-type signals and for providing an output proportional to the detected phase difference. Conventional three-state phase detector circuits which include phase detectors and charge pumps are often used in phase-locked-loop circuits. For example, a document entitled "Charge-Pump Phase-Lock Loops", by Floyd M. Gardner, IEEE Transactions On Communications, Vol. Com-28, No. 11, November 1980, pp. 1849–1858 describes a three-state charge pump. For example, the third paragraph on page 1850 of this document describes a three-position electronic switch controlled by three states of a phase/frequency detector (PFD).

Conventional phase-locked-loop circuits that use three-state phase detectors include an inherent dead-band at operation either in or near a phase locked condition. In the dead-band region, slight phase differences between the two clock-type signals cannot be detected. As the phase error of the phase-locked-loop circuit approaches zero, the phase detector no longer responds to the phase difference between the two signals and, in this sense, is dead in responding to a phase error between the signals. The dead-band is a result of limitations of circuit elements used to provide the phase-locked-loop circuit; that is, circuits composed of ideal elements would not exhibit such a dead-band.

The dead-band region of a conventional phase-locked-loop circuit that uses a three-state phase detector poses several significant drawbacks. For example, one effect of dead-band in a phase-locked-loop circuit is an uncorrectable jitter in a clock signal derived from a voltage controlled oscillator (VCO). When a near zero phase error condition exists, the absence of feedback in the phase-locked-loop circuit renders the VCO input, and thus its output, uncontrolled (i.e., a floating input). As the VCO output changes, the control loop of the phase-locked-loop circuit is unable to detect any change until the phase error exceeds the limits of the dead-band. The resultant jitter is intolerable in many applications, particularly where the phase-locked-loop circuit is used for frequency synthesis.

One approach to address the dead-band of a three-state phase detector in a phase-locked-loop circuit is to force the phase detector to operate outside its dead-band region. For example, a constant phase error term can be introduced into the phase detector as described in U.S. Pat. No. 5,036,216 (Hohmann et al), the disclosure of which is hereby incorporated by reference in its entirety. This patent describes the use of a constant phase error to ensure that phase detection circuitry produces a minimum jitter in the generated clock signal during a phase locked condition. Although the circuitry described in this patent is suitable for some applications (e.g, frequency synthesis), the disclosed system is unsuitable for high precision applications such as clock and data recovery, wherein the introduction of a fixed phase error would be detrimental to circuit operation.

Another approach for addressing the dead-band of a three-state phase detector is described in U.S. Pat. No. 4,322,643 (Preslar) the disclosure of which is hereby incorporated by reference. The phase comparator disclosed in the Preslar patent is a digital phase comparator which is effectively operated outside its dead-band.

The Preslar patent discloses a phase comparator 11 which includes an input terminal "V" for receiving a feedback signal from an output of voltage controlled oscillator 20. A second input "R" of phase comparator 11 receives a reference signal from a source 10. For each cycle of the reference signal, the phase comparator 11 produces pulsed output signals on terminals D and U proportional to any phase error between the input signals. The D and U pulses are used to drive charge pumps 16 and 14, respectively. The charge pumps drive the voltage controlled oscillator 20 via an integrator 8. As described at column 5, lines 25–31, a dead-band can occur if output pulses of the D and U terminals are shorter than turn-on times of charge pumps 14 and 16. Accordingly, column 5, lines 51–63 describe adding sufficient time duration to the U and D pulses to overcome the minimum turn-on time of the charge pumps. Thus, the Preslar patent discloses a circuit which, in accordance with ideal operation, would operate outside a dead-band. However, no practical way is disclosed to accurately tune a practical implementation of the circuit to compensate phase errors introduced during operation or to provide a desired phase offset.

SUMMARY OF THE INVENTION

Accordingly, the present invention is directed to providing a phase detector capable of establishing phase-locked-loop operation in a highly accurate and reliable manner. For example, exemplary embodiments detect a phase difference between at least two input signals to phase lock the input signals to one another. Exemplary embodiments include two phase detectors each of which receives the two input signals (e.g., three-state phase detectors), and each of which is forced to operate outside of its dead-band region by introducing predetermined phase delays for its inputs. Each of the two phase detectors detects a phase difference between its respective inputs. The two phase differences are then combined to produce a composite output signal formed as a net charge proportional to the net phase difference detected by the two phase detectors.

Where the predetermined phase delays of the two phase detectors are matched, the phase error between the two input signals is zero. In alternate exemplary embodiments, a built-in mechanism can be provided for adjusting the relative phases of the two input signals with respect to each other to achieve relatively low data-error rates in, for example, clock-and data-recovery applications.

Thus, exemplary embodiments generally relate to an apparatus for detecting a phase difference between a first signal and a second signal comprising (1) means for comparing said first signal and said second signal to provide a first phase difference; (2) means for comparing said first signal and said second signal to provide a second phase difference; and (3) means for combining said first phase difference and said second phase difference to produce a composite output signal using said first phase difference and said second phase difference.

BRIEF DESCRIPTION OF THE DRAWINGS

The present invention can be further understood with reference to the following description and the appended drawings wherein like elements are provided with the same reference numerals. In the drawings:

FIG. 1 shows an exemplary embodiment of the circuit in accordance with the present invention; and FIG. 2 shows a transfer curve for the exemplary FIG. 1 embodiment.

DETAILED DESCRIPTION OF THE PREFERRED EMBODIMENTS

FIG. 1 illustrates an exemplary phase-locked-loop circuit 100. The phase-locked-loop circuit includes an apparatus for detecting a phase difference between at least a first signal and a second signal, the phase detection apparatus being labelled 102.

The phase detection apparatus 102 includes a means for comparing a first signal with a second signal to provide a first phase difference. A comparing means for providing a first phase difference is generally labelled 104, and constitutes a first portion of the phase detection apparatus 102. A means for comparing the first signal and the second signal to provide a second phase difference is generally labelled 106, and represents a second portion of the phase detection apparatus 102.

In an exemplary embodiment, the first and second signals input to the comparing means 104 and 106 are a reference clock and a clock derived from a VCO, respectively. For example, in the exemplary FIG. 1 embodiment, a first signal can be a reference signal received via a reference input line 108, and the second signal can be a VCO-derived clock signal received via a VCO-derived clock signal input line 110. In the exemplary FIG. 1 embodiment, both the first and second signals can be clock-type signals such as square waves.

Of course, the first and second signals can be reversed such that the first signal can be considered the VCO-derived clock signal and the second signal can be considered the reference signal. In this case, those skilled in the art will appreciate that readily apparent modifications to the circuit would be necessary to accommodate polarity changes.

The first portion 104 of the phase detection apparatus 102 includes a means for delaying one of the first signal and the second signal to provide a first delayed signal. In the exemplary FIG. 1 embodiment, this delaying means is represented as a tunable delay circuit 112 for introducing a tunable delay delta-T1 to the reference signal. The tunable delay can be adjusted via a tuning signal 109 labelled "tune1" in FIG. 1. Those skilled in the art will appreciate that the tuning signal can be any operator adjustable input for modifying the signal delay delta-T1.

The first portion of the phase detection apparatus 102 further includes means for detecting a phase difference between the first delayed signal and the other one of the first signal and the second signal. As illustrated in the exemplary FIG. 1 embodiment, the phase difference detecting means is generally labelled 114 and can be any known phase detector for identifying a phase difference between two signals received at its inputs.

In the exemplary first portion 102, the delayed reference signal from the tunable delay circuit 112 and the undelayed VCO-derived clock signal received via input 110, are used to provide a first phase difference signal on phase detector output lines 116 and 118. The phase detector output signals can be pulses in electrical voltage which can be converted to a charge proportional to the first phase difference by a means for generating a charge, represented in FIG. 1 as a charge pump 120. The charge pump 120 produces a charge proportional to the first phase difference output from the phase detector 114, with this charge being positive or negative, depending on whether the phase difference is positive or negative. Those skilled in the art will appreciate that the output of the charge pump need not be charge but rather, can be any variable which is or which can be rendered proportional to the detected phase difference (e.g., current). The output of the charge pump 120 can be input to a filtering means represented in the exemplary FIG. 1 embodiment as a loop filter 122.

The second portion 106 of the phase detection apparatus 102 is configured similar to that of the first portion 104. However, in the second portion 106, a delay means generally represented as a tunable delay circuit 124 is used for delaying the other one of the first signal and the second signal to provide a second delayed signals. In the exemplary FIG. 1 embodiment, the VCO-derived clock signal is therefore subjected to the tunable delay of the delay circuit 124. The delay of tunable delay circuit 124 can be adjusted via a tuning signal 111 labelled "tune2", in a manner similar to that described with respect to the tunable delay circuit 112. In an exemplary embodiments tunable delay circuit 112 and tunable delay circuit 124 can be independently tuned to different delays (which can be equal to one another).

The delayed VCO-derived clock signal and the undelayed reference signal received via input line 108 are applied to a phase difference detecting means represented as a phase detector 126. Output lines 128 and 130 of the phase detector 126 provide a second phase difference signal between the reference signal and the VCO-derived clock signal. Of course, the phase difference detecting means can be configured as a single element which includes first and second phase detectors for producing the first and second phase difference signals.

The second phase difference signal is input to a charge pump 132. Like the charge pump 120, the charge pump 132 represents a means for generating a charge proportional to a phase difference. In this case, the charge pump 132 produces a charge proportional to the second phase difference output from the phase detector 126, with this charge being positive or negative, depending on whether the phase difference is positive or negative, respectively.

The phase detection apparatus 102 further includes a means for combining the first phase difference from the phase detector 114 and the second phase difference from the phase detector 126 to produce a composite output signal on an output line 134. In an exemplary embodiment, the outputs from the phase detectors 114 and 126 can be combined by connecting the output wires from the charge pumps 120 and 132, respectively. Because the tunable delay introduced by the tunable delay circuit 112 is applied to the reference signal in the first portion 104 of the phase detection apparatus, while the tunable delay introduced by the tunable delay circuit 124 in the second portion 106 is applied to the VCO-derived clock signal, these delays, if exactly equal, should exactly cancel at the combining means. The composite output signal produced by the combining means will identify a phase difference due to an out-of-lock condition between the reference signal and the VCO-derived clock signal.

In alternate embodiments, one of the tunable delays of the tunable delay circuits 112 and 124 can be selected greater than the other. In this case, a residual difference will exist in the phase difference output signal produced by the combining means even when the two input signals 108 and 110 are phase-locked. Thus, an accurate phase displacement between the two input signals 108 and 110 can be established and maintained. The ability to establish an accurate, tunable phase displacement between the VCO-derived clock signal and a reference signal is useful in producing, for example, accurate clock- and data-recovery.

The composite output signal is applied to the loop-filter to remove noise and other signals outside the band-width of operation. The filtered phase difference output signal can be used to control the frequency of oscillation of a VCO 136. By using the output of the VCO 136 as the VCO-derived clock signal on input line 110, the VCO can thus be phase locked to the reference signal. The VCO can be used for any desired application, including frequency synthesis, as well as clock-and data-recovery.

As described herein, the composite output signal produced by the phase detection apparatus 102 represents a phase difference between the reference signal on input line 108 and the VCO-derived clock signal on input line 110. For example, when the reference signal leads the VCO-derived clock signal, a positive phase difference can be considered to exist. However, when the reference signal lags the VCO-derived clock signal, a negative phase difference can be considered to exist.

FIG. 2 illustrates an exemplary transfer curve associated with operation of the exemplary FIG. 1 embodiment. In FIG. 2, output charge/phase correction is plotted along a vertical axis against phase error (i.e, a phase difference between the reference signal and the VCO-derived clock signal) along the horizontal axis. The FIG. 2 transfer curve is plotted for the exemplary case where delta-T1 and delta-T2 are equal.

To describe operation of the FIG. 1 phase detection apparatus 102, each of the first portion 104 and the second portion 106 will be considered independently. For example, if the first portion 104 is operating alone, the reference signal and the VCO-derived clock signal will lock with a phase difference of delta-T1 (e.g, a positive phase difference). Similarly, if the second portion 106 of the phase detection apparatus is considered to be operating independently, the reference signal and the VCO-derived clock signal will lock with a phase difference of delta-T2 (e.g., a negative phase difference). Each of the first portion 104 and the second portion 106 can be considered to operate within their respective dead-bands when considered alone.

When both the first portion 104 and the second portion 106 are operating collectively, the phase-locked-loop cannot sustain a phase difference of both positive delta-Ti and negative delta-T2. Accordingly, a balance between the first and second phase differences is achieved. In the case where delta-TI equals delta-T2, the output signal on output line 134 is zero, and the phase difference between the reference signal on input line 108 and the VCO-derived clock signal on input line 110 is zero. Alternately, by adjusting delta-TI and/or delta-T2 relative to one another, the relative phases of the reference signal and the VCO-derived clock signal can be modified. By phase locking the reference signal and the VCO-derived clock signal with a predetermined phase difference, a desired operation (e.g., a optimization for clock-and data-recovery) can be achieved.

By properly choosing delta-T1 and delta-T2, both the first portion 104 and the second portion 106 of the phase detection apparatus 102 can be forced to operate outside their dead-bands. FIG. 2 illustrates a composite curve 200 having a first transfer curve 201 for the first portion 104 and a second transfer curve 203 for the second portion 106. The FIG. 2 transfer curves 201 and 203 further illustrate dead-bands labelled 202 and 204 for the first portion 104 and the second portion 106, respectively.

The combined operation of the first and second portions of the phase detection circuit 102, as illustrated by the FIG. 2 composite curve 200 (i.e., transfer characteristic), enables the phase-locked-loop circuit to detect a phase difference between the reference signal input and the VCO-derived clock signal input without being affected by the dead-band regions in the first and second portions of the phase detection apparatus. However, it should be noted that at two places in the FIG. 2 transfer characteristic, only one portion of the phase detection apparatus 102 will be operating. More particularly, during the dead-band 204 of the second portion 106, only the first portion 104 of the phase detection apparatus 102 is operating. Similarly, during the dead-band 202 of the first portion 104, only the second portion 106 of the phase detection apparatus 102 is operating. However, because a parallel relationship exists between the first and second portions of the phase detection apparatus 102, the output signal on output line 134 accurately reflects the phase difference between the reference signal and the VCO-derived clock signal.

In accordance with exemplary embodiments of the present invention, phase noise, or jitter, of a frequency synthesizer can be significantly reduced by eliminating the effect of dead-band in the phase detection apparatus. For example, exemplary embodiments of the present invention can reduce phase noise standard-deviation by 50% or greater (e.g, from 7 degrees to 3.3 degrees). Further, exemplary embodiments of the present invention provide a spectral density which remains relatively flat as the frequency output of the VCO approaches the desired oscillating frequency output by the VCO. Thus, frequency drift of the oscillating frequency produced by the VCO can be substantially eliminated, thereby reducing or eliminating any strength of signals close to the specified oscillating frequency.

Those skilled in the art will appreciate that the components used in the exemplary FIG. 1 embodiment can be readily obtained as off-the-shelf components. For example, components similar to those described in the aforementioned Hohmann and Preslar patents can be used. Alternate components will be readily available to those skilled in the art, and should be selected to accommodate the desired accuracy of the phase detection required for a specific application.

Further, those skilled in the art will appreciate that any relative delays can be selected for the tunable delay circuits 112 and 124, such that the exemplary FIG. 1 embodiment can be considered tunable for use in exemplary applications such as data-recovery. For example, if delta-T1 is intentionally modulated with respect to delta-T2 in the exemplary FIG. 1 embodiment to produce a predetermined phase difference between the VCO-derived clock signal and the reference signal, the composite phase difference output signal can be tuned to obtain an optimal data-error rate. A forced phase difference between the reference signal and the VCO-derived clock signal can be used to locate data pulses at a specific location within a window (e.g., centered within a window) so that sufficient time exists to read the data within the window.

In alternate embodiments, those skilled in the art will readily appreciate that any type of input signal can be used in accordance with the present invention. For examples while square waves were mentioned above, those skilled in the art will recognize that any wave, such as sine waves, can be input to the phase detection apparatus. Further, those skilled in the art will appreciate that the use of three-state phase detectors in exemplary embodiments of the present invention is by way of illustration only, and that phase tunability features of the present invention can be used with any phase detectors, used in conjunction with any application. In addition, the present invention is not limited to electronics applications, but can be used in any application where a particular phase relationship between two signals is desired.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A phase lock loop, comprising:

a first reference signal and a second output signal;

first delaying means for delaying said reference signal to produce a first delayed signal;

second delaying means for delaying said output signal to produce a second delayed signal;

first comparison means for comparing said first delayed signal and said output signal to provide a first phase difference signal;

second comparison means for comparing said reference signal and said second delayed signal to provide a second phase difference signal;

means for summing algebraically said first phase difference and said second phase difference signals to produce a phase difference output signal; and a voltage controlled oscillator responsive to said phase difference output signal for producing said output signal;

wherein, for a range of phase differences between the first reference signal and the second output signal, the range including zero phase difference, the phase difference output signal exhibits a substantially constant, non-zero slope.

2. Apparatus according to claim 1 wherein said first comparison means further includes:

means for generating a charge proportional to said first phase difference.

3. Apparatus according to claim 2, wherein said second comparison means further includes:

means for generating a charge proportional to said second phase difference.

4. Apparatus according to claim 3, wherein said first delaying means for providing a first delayed signal establishes a tunable delay of said first signal.

5. Apparatus according to claim 4, wherein said second delaying means for providing a second delayed signal establishes a tunable delay of said second signal.

6. Apparatus according to claim 5, wherein said tunable delay of said second signal is equal to said tunable delay of said first delayed signal.

7. Apparatus according to claim 5, wherein said charge generating means for generating said first phase difference and said charge generating means for generating said second phase difference are charge pumps.

8. Apparatus according to claim 5, further comprising:

means for filtering the phase difference output signal.

9. Apparatus according to claim 8, wherein said filter means is a loop-filter for providing a filtered phase difference output signal.

10. Apparatus according to claim 9, further comprising:

means for generating a voltage controlled frequency output in response to said filtered phase difference output signal, said voltage controlled frequency output being used to generate one of said first signal and said second signal.

11. Method for achieving phase lock between a first reference signal and a second output signal produced by a voltage controlled oscillator, the method comprising the steps of:

delaying said first signal to produce a first delayed signal;

delaying said second signal to produce a second delayed signal;

comparing said first delayed signal and said second signal to provide a first phase difference signal;

comparing said first signal and said second signal to provide a second phase difference signal;

summing algebraically said first phase difference and said second phase difference signals to produce a phase difference output signal; and controlling the voltage controlled oscillator in response to said phase difference output signal so as to bring the first signal and the second signal into phase lock a predetermined phase relationship;

wherein, for a range of phase differences between the first signal and the second signal, the range including zero phase difference, the phase difference output signal exhibits a substantially constant, non-zero slope.

12. Method according to claim 11, wherein said step of delaying the second one of said first signal and said second signal further includes a step of:

tuning a delay of said second delayed signal to equal a delay of said first delayed signal.

13. Method according to claim 11, wherein said step of delaying the second one of said first signal and said second signal further includes a step of:

tuning a delay of said second delayed signal to be different from a delay of said first delayed signal.

14. Method according to claim 11, wherein each of said steps of comparing for providing said first phase difference and comparing for providing said second phase difference further includes the step of:

generating a charge proportional to each of said first and second phase differences.

15. Method according to claim 14, further comprising the step of:

generating a voltage controlled frequency output in response to said phase difference output signal, said voltage controlled frequency output being used as one of said first signal and said second signal.

* * * * *